United States Patent [19]

Schutten et al.

[11] Patent Number: 4,553,151

[45] Date of Patent: Nov. 12, 1985

[54] BIDIRECTIONAL POWER FET WITH FIELD SHAPING

[75] Inventors: Herman P. Schutten, Milwaukee, Wis.; Robert W. Lade, Fort Myers, Fla.; James A. Benjamin, Waukesha, Wis.

[73] Assignee: Eaton Corporation, Cleveland, Ohio

[21] Appl. No.: 421,931

[22] Filed: Sep. 23, 1982

[51] Int. Cl.[4] ............... H01L 29/10; H01L 29/78; H01L 29/06; H01L 27/02
[52] U.S. Cl. .................... 357/23.4; 357/23.8; 357/55; 357/53; 357/41
[58] Field of Search ...... 357/23 VD, 23 HV, 23 MG, 357/39, 41, 47, 53, 55, 23.8, 47

[56] References Cited

U.S. PATENT DOCUMENTS

| | | | |
|---|---|---|---|
| 2,994,811 | 8/1961 | Senitzky | 357/55 |
| 3,629,667 | 12/1971 | Lubart et al. | |
| 4,163,988 | 8/1979 | Yeh et al. | 357/23 UD |
| 4,199,774 | 4/1980 | Plummer | 357/41 |
| 4,243,997 | 1/1981 | Natori et al. | |
| 4,300,150 | 11/1981 | Colak | 357/52 |
| 4,364,073 | 12/1982 | Becke et al. | 357/23 UD |
| 4,364,074 | 12/1982 | Garnache et al. | |
| 4,414,560 | 11/1983 | Lidow | |
| 4,455,740 | 6/1984 | Iwai | |
| 4,503,449 | 3/1985 | David | 357/55 |

FOREIGN PATENT DOCUMENTS

| | | | |
|---|---|---|---|
| 0073585 | 6/1979 | Japan | 357/39 |
| 57-24564 | 2/1982 | Japan | 357/23.8 |

OTHER PUBLICATIONS

IEDM Technical Digest, Dec. 8, 1980, by Tihanyi, pp. 75–78.
IEEE Transactions on Electron Devices, vol. ed-25, #10, "Non-Planar Power FETs", by Salama et al., Oct. 1978.
P. Ou-Yang, "Double Ion-Implantation V-MOS Tech," J. of S-S Ckts., vol. SC-12, #1, Feb. 1977, pp. 3–10.
H. Lee et al., "Short-Channel Field-Effect Transistors in V-Grooves", IBM Tech. Discl. Bulletin, vol. 22, #8B, Jan. 1982, pp. 3630–3634.
C. Hu, "A Parametric Study of Power MOSFETs", IEEE Electron Device Conference, Paper CH1461-3/79, 0000–0385.
Ammar & Rogers, "UMOS Transistors on Silicon", Transactions IEEE, ED-27, pp. 907–914, May, 1980.

Primary Examiner—Andrew J. James
Assistant Examiner—Mark Prenty
Attorney, Agent, or Firm—Andrus, Sceales, Starke & Sawall

[57] ABSTRACT

Lateral FET structure is disclosed for bidirectional power switching, including AC application. Voltage blocking capability is enhanced by field shaping in the drift region. In the OFF state, depletion from a channel region junction and from a field shaping region junction spread toward each other through the drift region to straighten out field lines and prevent curvature crowding of field lines at edges of notch means extending into the drift region and separating a pair of source regions and a pair of channel regions.

19 Claims, 5 Drawing Figures

BIDIRECTIONAL POWER FET WITH FIELD SHAPING

TECHNICAL FIELD

The invention relates to power switching semiconductors, and more particularly to power MOSFETS (metal oxide semiconductor field effect transistors), and the like.

BACKGROUND AND SUMMARY

The invention provides improved lateral FET structure for bidirectional power switching, including AC application. The invention particularly provides enhanced OFF state voltage blocking capability by means of field shaping in the drift region to straighten out field lines and prevent curvature crowding and gradient concentration which reduces OFF state voltage blocking capability.

Copending application Ser. Nos. 390,719 now abandoned and 390,479, filed June 21, 1982, disclose AC power FET structure. The latter includes a notch extending downwardly from a top major surface to separate left and right source regions and left and right channel regions, and direct the drift region current path between the channels around the bottom of the notch. Gate electrode means in the notch proximate the channels controls bidirectional conduction.

In the preferred embodiment of the present invention, a field shaping region forms a junction with the drift region opposite the channel region junctions with the drift region. The field shaping region is referenced through diode junctions to main electrodes connected to respective source regions. In the OFF state, depletion from the first channel region junction and from the field shaping region junction spread toward each other through the drift region to straighten out field lines in the drift region and prevent curvature crowding of field lines at edges of the notch. Likewise, in the OFF state, and during the other half cycle of an AC source for example, depletion from the second channel region junction and from the field shaping region junction spread toward each other through the drift region to straighten out field lines in the drift region and prevent curvature crowding of field lines at edges of the notch. This provides higher OFF state voltage blocking capability.

DETAILED DESCRIPTION

Figure 1:
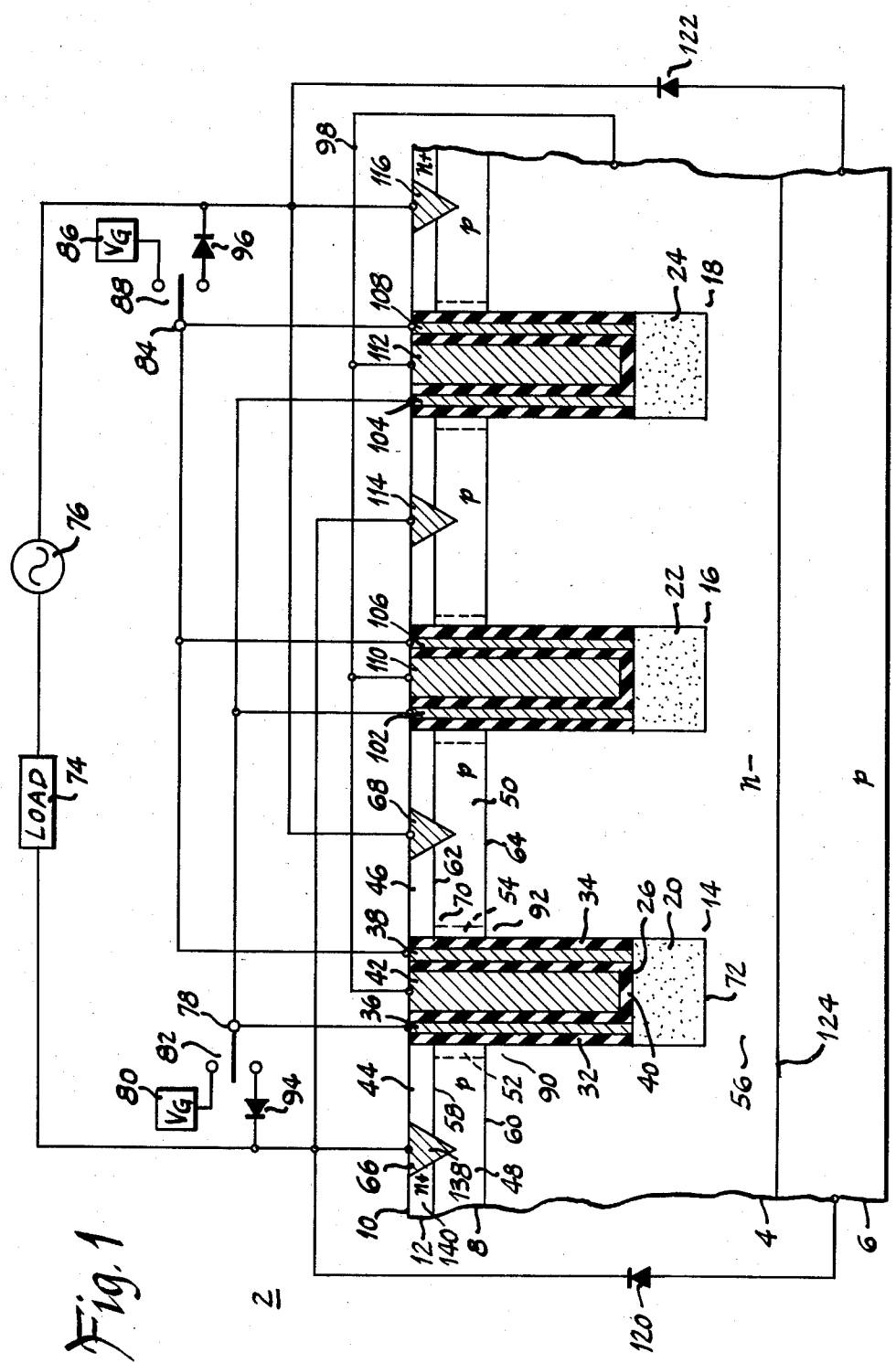
FIG. 1 is a schematic sectional view of bidirectional power FET structure constructed in accordance with the invention.

FIG. 1 shows lateral bidirectional power FET structure constructed in accordance with the invention. FET structure 2 includes an epitaxial layer 4 of one conductivity type, such as n type, grown on a bottom layer 6 of opposite conductivity type, such as p type, which will provide the field shaping to be described. A p layer 8 is diffused or grown on epitaxial layer 4 from top major surface 10 followed by ion implantation and/or diffusion of n+ top layer 12.

A plurality of notches 14, 16, 18 and so on, are formed in epitaxial layer 4 from top major surface 10 through n+ layer 12 and through top p layer 8 into n-layer 4. These notches may be anisotropically etched, as known in the art; C. Hu, "A Parametric Study of Power MOSFETs", IEEE Electron Device Conference, Paper CH1461-3/79, 0000-0385; IEEE Transactions Electron Devices, Vol. ED-25, No. 10, October, 1978; and Ammar and Rogers, "UMOS Transistors on Silicon", Transactions IEEE, ED-27, pages 907–914, May, 1980. Alternatively, the notches may be formed by a porous silicon region in accordance with the known anodization technique of passing a fixed current through the localized region in the presence of concentrated hydrogen fluorid to create a structural change in the silicon which remains single crystalline with the substrate but becomes porous. In the case of anisotropic etching, the bottom of the notch is filled with insulative material. In the case of anodization, the substrate is subjected to an oxidizing atmosphere such that the oxygen enters the pores in the porous notched region and rapidly oxidizes these regions as shown at 20, 22, 24 and so on, which regions are still single crystalline with epitaxial layer 4 but substantially nonconductive. Before or after the anodization, the notches are etched down to levels 26, 28, 30 and so on.

In notch 14, silicon dioxide insulating layers 32 and 34 are grown along the inner facing surfaces of the notch. First and second gate electrodes 36 and 38 are then formed along the left and right vertical sides of the notch, as by shadow evaporation of conductive material such as aluminum from an angle or low pressure chemical vapor deposition (LPCVD) of polysilicon. Another insulating oxide layer 40 is provided along the facing sides of the gate electrodes and along the bottom of the upper notch section, as by chemical vapor deposition. A shielding electrode 42 is then deposited in the notch and is insulated between the gate electrodes by insulating layer 40. The insulated gating and shielding structure in notches 16 and 18 is comparable.

Notch 14 extends from top major surface 10 downwardly through layers 12 and 8 into layer 4. Notch 14 separates top layer 12 into first and second left and right source regions 44 and 46 and extends therebetween. Notch 14 separates layer 8 into first and second regions 48 and 50 containing left and right channel regions 52 and 54 and extends therebetween. The epitaxial layer 4 around the notch forms a drift region 56. Junction 58 is formed between the left source region and left channel region. Junction 60 is formed between the left channel region and the drift region. Junction 62 is formed between the right source region and the right channel region. Junction 64 is formed between the right channel region and the drift region. Main electrode metalization 66 is deposited in an etched groove on top major surface 10 and contacts source region 44 and region 48 containing channel 52. Main electrode metalization 68 is deposited in an etched groove on top major surface 10 and contacts source region 46 and region 50 containing right channel region 54.

Upon application of a positive voltage to left gate electrode 36 with respect to left main electrode 66, electrons in p region 48 are attracted to channel region 52 to invert the conductivity type therein to n type. This allows electron flow from n+ source region 44 through channel 52 into drift region 56 in substrate 4. If right main electrode 68 is positive with respect to left main electrode 66, current may then flow from p region 50 momentarily across forward biased PN junction 64 into drift region 56, then through left channel 52 to source region 44 and left main electrode 66. As soon as current starts to flow through the FET, the voltage across main electrodes 68 and 66 starts to drop, which in turn reduces the potential in various regions of the FET, including portion 70 of a p layer region 50 adjacent the right FET channel 54. This falling potential causes carrier electron flow into channel region 54 because portion 70 becomes negative relative to right gate electrode 38 at a given gate potential, whereby positive right gate electrode 38 attracts electrons into right channel region 54 to invert the conductivity type thereof to n type, and hence render channel 54 conductive. Forward biased PN junction 64 conducts only momentarily until the second channel 54 turns ON.

The main current path through FET 2 is from right main electrode 68 through right source region 46, downwardly through right vertical channel region 54 along the right side of notch 14, then further downwardly into drift region 56 along the right side of the notch, then around the bottom 72 of notch 14, then upwardly along the left side of notch 14 in drift region 56 of epitaxial layer 4, then upwardly through left vertical channel region 52 along the left side of notch 14, then through left source region 44 to left main electrode 66.

The structure is bidirectional, and thus current may also flow from left main electrode 66 to right main electrode 68 when right gate 38 is positive with respect to right main electrode 68. Electrons in p layer region 50 are attracted into channel region 54 by right gate 38 to thus invert channel region 54 to n type and hence allow electron flow from n+source region 46 through channel 54 into drift region 56 of epitaxial layer 4. If left main electrode 66 is positive with respect to right main electrode 68, current then flows from p layer region 48 momentarily across forward biased PN junction 60 until channel 52 turns ON. The main current path is from left main electrode 66 through left source 44, through left channel 52, through drift region 56, through right channel 54, through right source 46 to right main electrode 68. Main electrode 68 thus serves as an electron current source when a negative voltage is applied thereto relative to the voltage on left main electrode 66, and serves as an anode when a positive voltage is applied thereto relative to the voltage on left main electrode 66.

The application of electrical gate potential to gate electrodes 36 and 38 enables them to produce electric fields of sufficient intensity to invert the conductivity type in the first and second channel regions 52 and 54. Upon application of voltage of either polarity to the first and second source regions 44 and 46, electric current can flow in a respective corresponding direction between them, under control of the electrical gate potential of the gate electrode means 36 and 38. The current flow between spaced apart regions 44 and 46 is controllable by controlling the electric fields in channel regions 52 and 54, which in turn are controllable by controlling the electric potential on the gate electrode means 36 and 38.

In the absence of gate potential on gate electrodes 36 and 38, channel regions 52 and 54 are p type, and the device is in a blocking OFF state. Current from left main electrode 66 to right main electrode 68 is blocked by junction 64. Current flow in the other direction from right main electrode 68 to left main electrode 66 is blocked by junction 60.

Bidirectional FET 2 may be used to control AC power. FIG. 1 schematically shows a load 74 and a source of AC power 76 connected across main electrodes 66 and 68. Left gate electrode 36 is connected by a gate terminal 78 to a source of gate potential 80 through switch means 82. Right gate electrode 38 is connected by a gate terminal 84 to a source of gate potential 86 through switch means 88. In the ON state of FET 2, switches 82 and 88 are in an upward position such that given polarity gate potential is applied to gate electrodes 36 and 38. The gate potential is higher than the most negative of the main electrodes in each half cycle.

When right main electrode 68 is positive with respect to left main electrode 66, as driven by AC source 76, left gate electrode 36 is positive with respect to negative left main electrode 66 connected to source region 44 and p layer region 48. Hence, left channel 52 is inverted to n type and conduction occurs, i.e. current flows from positive right main electrode 68 through right source 46, through right channel 54, through drift region 56 around the bottom 72 of notch 14 in epitaxial layer 4, through left channel 52, through left source 44 to negative left main electrode 66 and through load 74.

In the other half cycle of AC source 76, left main electrode 66 is positive with respect to right main electrode 68, and right gate electrode 38 is positive with respect to negative right main electrode 68 connected to right source 46 and p layer region 50. Conduction is thus enabled through right channel 54, and current flows from positive left main electrode 66 through left source 44, through left channel 52, through drift region 56 around the bottom of notch 14, through right channel 54, to right source 46 and right negative main electrode 68.

Shielding electrode means 42 prevents electric field divergence induced depletion in drift region portions 90 and 92, which in turn prevents unwanted inducement of conduction channels in the drift region during the OFF state. This enables the use of non-floating gates, i.e. referencing of gate electrodes 36 and 38 to the same potential level of one or more of the main electrodes in the OFF state of FET 2. In the OFF state of FET 2, switches 82 and 88 are in the downward position, connecting gate terminal 78 through reverse blocking diode 94 to left main electrode 66, and connecting gate terminal 84 through reverse blocking diode 96 to right main electrode 68.

In the OFF state of FET 2 and during the first half cycle of AC source 76, the voltage on right main electrode 68 rises positively with respect to left main electrode 66. Junction 64 is forward biased and thus the potential level in drift region 56 of epitaxial layer 4 is at substantially the same level as electrode 68, namely within a single junction drop thereof across forward biased PN junction 64. Left gate electrode 36 is relatively negative since it is tied through diode 94 to negative left main electrode 66 and the other side of the AC source. There is thus an electric field gradient established between right region 92 and the left gate electrode 36. The potential level along the left side of notch 14 in epitaxial layer 4 is at a very low level and increases as one moves vertically downwardly along the left edge of notch 14. The electric field gradient between the left and right edges of notch 14 causes attraction of given polarity carriers from epitaxial layer 4 into region 92.

As the positive voltage on right main electrode 68 rises higher, drift region portion 92 becomes more positively biased relative to left gate electrode 36, and the electric field gradient causes attraction of holes toward, and depletion of electrons away from, drift region portion 92. If the carrier concentration becomes great enough, the conductivity type of portion 92 is inverted to p type such that conduction occurs through an induced p channel along portion 92 around notch 14. A conduction channel so formed extends around to the left side of the notch, and junction 60 loses its reverse blocking ability, whereby FET 2 can no longer block voltage in its OFF state from source 76.

Shielding electrode 42 is connected by terminal 98 to epitaxial layer 4 to be at the same potential level thereof and at substantially the same potential level as the main electrodes, namely within a single junction drop thereof across forward biased junction 64 or 60. As the potential of right main electrode 68 rises, so also does drift region portion 92 and epitaxial layer 4 across forward biased junction 64, and thus so also does the potential on shielding electrode 42 rise, via connection 98. Shielding electrode 42 is insulated between left gate electrode 36 and drift region portion 92 to thus shield the latter from the electric field gradient toward left gate electrode 36. Shield 42 thus prevents an electric field gradient from being established at drift region portion 92, whereby to prevent attraction of holes to the right edge of notch 14 at portion 92 below junction 64. As the potential level in drift region portion 92 rises, so does the potential level of shield 42, whereby the relatively negative left gate electrode 36 no longer affects the conductivity characteristics of drift region portion 92. Shield 42 thus prevents unwanted inducement of conduction channels in the drift region during the OFF state.

During the second half cycle of AC source 76, and during the OFF state of FET 2, left main electrode 66 rises positively with respect to right main electrode 68. Shield electrode 42 is connected by terminal 98 to epitaxial layer 4 and drift region portion 90 and thus rises positively therewith due to the forward junction drop across junction 60 from rising left main electrode 66. Thus, as the potential of left main electrode 66 becomes greater, so does the potential level of drift region portion 90 of epitaxial layer 4 due to the single junction drop thereto across forward PN junction 60. This potential rises positively with respect to right gate electrode 38 which is connected to negative right main electrode 68 through diode 96. If the applied voltage becomes great enough, the relatively negative right gate electrode 38 would establish a large enough electric field gradient across notch 14 to effect conductivity inversion and induce a conduction channel in drift region portion 90. Shield 42 prevents this unwanted inducement of conduction channels during the OFF state in the drift region. Shield electrode 42 is between right electrode 38 and drift region portion 90 and is at substantially the same potential level as left main electrode 66, and thus shields drift region portion 90 from electric field gradients caused by right gate electrode 38.

Higher OFF state voltage blocking capability is further afforded by the increased drift region current path length. The current path between the main electrodes extends from each source region downwardly through the channel regions and downwardly and around the bottom 72 of the notch. This increases the drift region current path length and affords higher OFF state voltage blocking capability without increasing the lateral dimension along top major surface 10, whereby to afford high density, high voltage bidirectional FET structure with relatively low ON state resistance.

As seen in FIG. 1, a plurality of FETs are afforded in the integrated structure. Top layers 12 and 8 are further split and separated into laterally spaced respective source regions and channel regions by respective notches 16 and 18. Main electrode metalizations are provided comparably to that described, and connected in series in the AC load line, or in parallel as shown in FIG. 1. Left gate electrodes 102 and 104 are connected in parallel with left gate electrode 36 to gate terminal 78. Right gate electrodes 106 and 108 are connected in parallel with right gate electrode 38 to gate terminal 84. Shielding electrodes 110 and 112 are connected in parallel with shielding electrode 42 to terminal 98.

Main electrode 68 provides the source electrode for the FET to the left around notch 14, and also provides the source electrode for the FET to the right around notch 16. Main electrode 114 provides the drain electrode for the FET around notch 16, and also provides the drain electrode for the FET around notch 18. In the other half cycle of AC source 76, the roles of electrodes 68 and 114 are reversed, i.e. electrode 68 is the drain for its left and right FETs around respective notches 14 and 16, and electrode 114 is the source for its left and right FETs around respective notches 16 and 18. Alternate electrodes 66, 114 and so on, are thus connected to one side of the AC source, and the other alternate electrodes 68, 116 and so on, are connected to the other side of the AC source.

The present invention affords yet further enhanced OFF state voltage blocking capability, in addition to the above noted features. The present invention further enhances OFF state voltage blocking capability by providing field shaping to straighten out field lines in the drift region and prevent curvature crowding of field lines at the edges of notches 14, 16, 18 and so on, which reduces OFF state voltage blocking capability.

Bottom p layer 6 provides a field shaping region. This region is referenced to substantially the same potential level as main electrodes 66 and 68 through respective first and second diodes 120 and 122. These diodes are connected between the main terminals in series opposition, with p region 6 interposed therebetween.

In operation, during the OFF state, as the potential on main electrode 68 rises, the reverse bias on junction 60 increases, and the depletion region spreads further away from junction 60 downwardly into epitaxial layer 4. Junction 124 between the field shaping region 6 and the drift region 56 is likewise reverse biased due to the connection through diode 120 to the negative main electrode 66, and thus the depletion region around junction 124 spreads further away therefrom upwardly into drift region 56. Junctions 124 and 60 are opposite each other such that in the OFF state depletion regions from these junctions spread towards each other through drift region 56. This in turn straightens field lines in drift region 56 which would otherwise curve and crowd at edges of notch 14.

Figure 2:
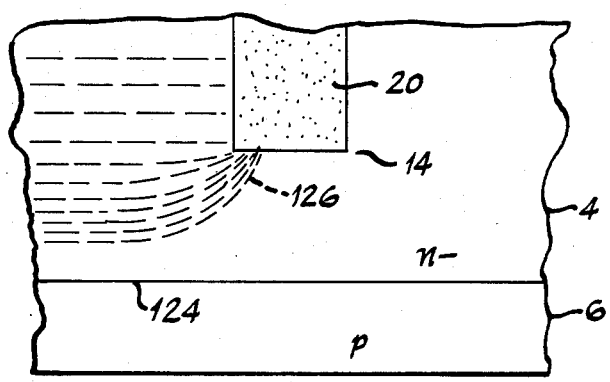
FIG. 2 is a schematic illustration of field line curvature and crowding around a notch edge, before the field shaping afforded by the present invention.

FIG. 2 shows the curvature crowding of field lines without the field shaping afforded by the invention. The curvature crowding is particularly critical in area 126 at the edge of notch 14. This curvature crowding of field lines and resultant gradients reduces the OFF state voltage blocking capability.

Figure 3:
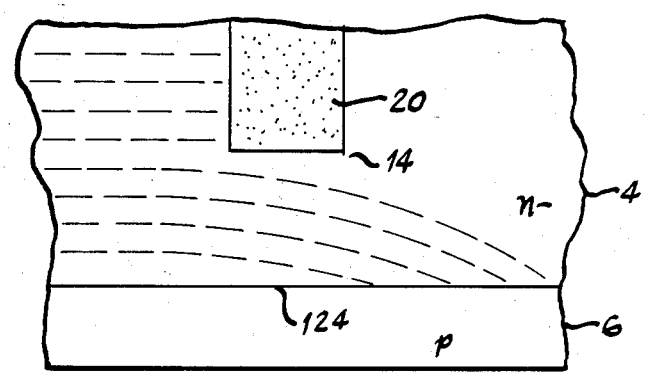
FIG. 3 is a schematic illustration like FIG. 2 but showing the straightening of field lines afforded by the field shaping of the present invention.

FIG. 3 shows the straightening of the field lines afforded by the field shaping of the present invention. Instead of curving and crowding at edges of notch 14, the field lines instead are straightened, and may even bend slightly the other way, downwardly toward junction 124. This spreading and straightening of the field lines increases the OFF state voltage blocking capability. In the other half cycle of the AC source, the field lines are likewise prevented from curving and crowding towards the right edge of the notch.

Figure 4:
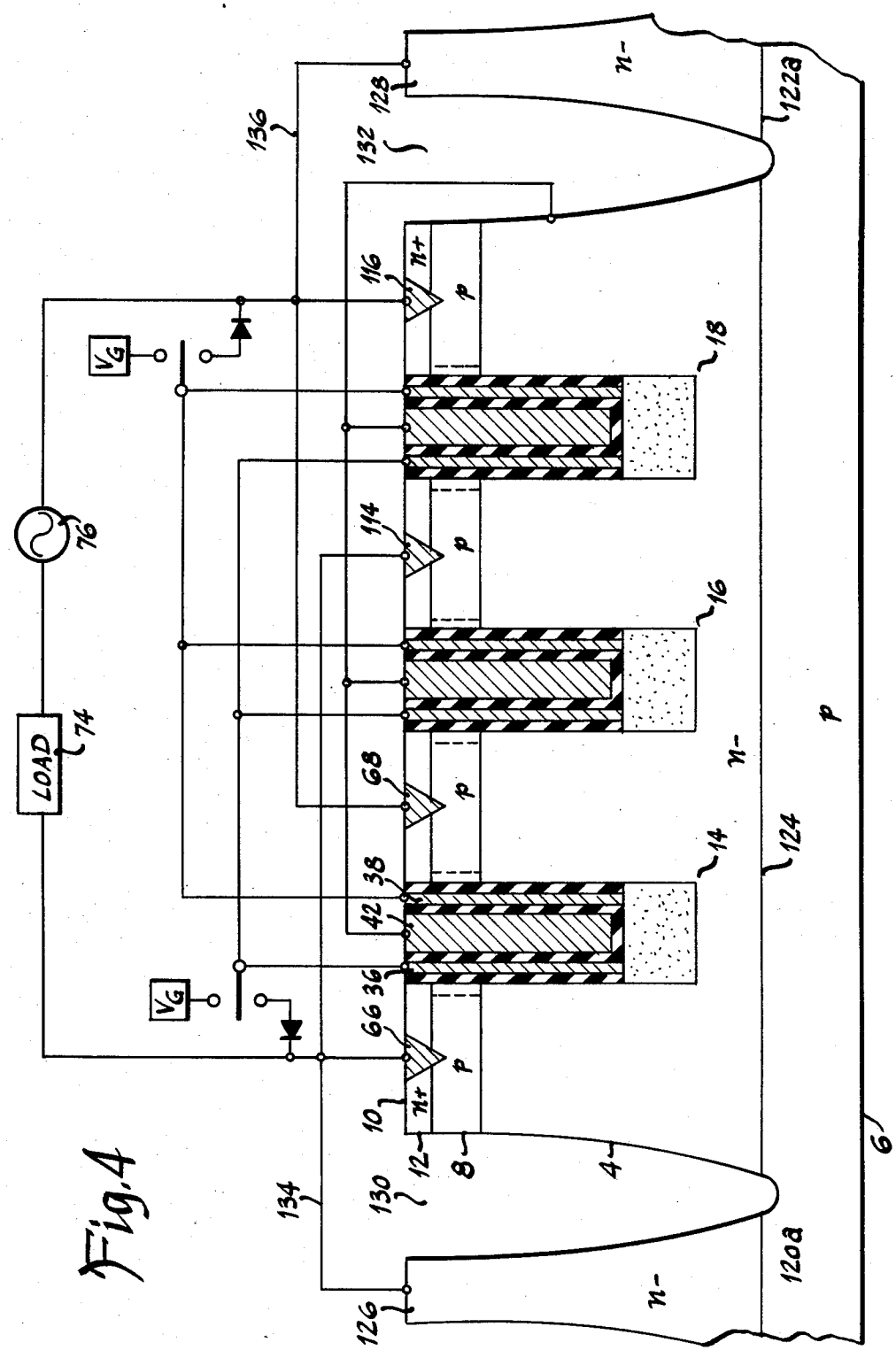
FIG. 4 is an alternate embodiment of FIG. 1.

FIG. 4 shows an alternate embodiment of FIG. 1, and like reference numerals are used where appropriate to facilitate clarity. Diodes 120 and 122 are formed by integral junctions 120a and 122a between field shaping bottom region 6 and respective first and second isolation regions 126 and 128 separated from the FET source regions, channel regions and drift region by respective isolation moats 130 and 132 extending downwardly from top major surface 10 through epitaxial layer 4 into p region 6. The n— isolation regions are connected by respective terminals 134 and 136 to respective main electrodes on opposite sides of the AC source. An advantage of the structure is the integral avalanche protection provided for the FET blocking junctions in the OFF state, as described in copending Ser. No. 06/421,932, filed Sept. 23, 1982.

Figure 5:
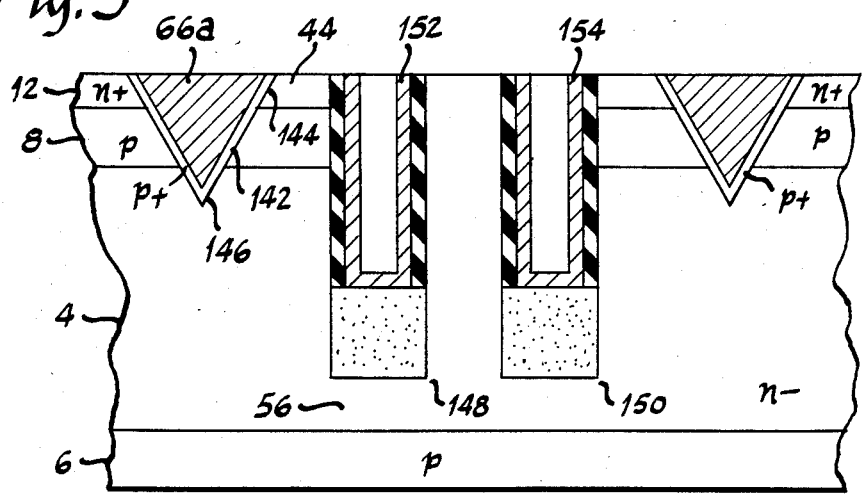
FIG. 5 shows further alternative structure to FIG. 1.

While FIG. 1 shows split gate electrode means, provided by split first and second gate electrodes 36 and 38, an alternative is a single gate electrode filling the notch. The split gate structure of FIG. 1 is preferred. In a further alternative, the main electrodes such as electrode 66 may extend along the top major surface 10, and p region 48 may extend upwardly in area 138 to top major surface 10 to separate left and right source regions 140 and 44. with main electrode 66 contacting the source regions and the channel containing region 48. In a further alternative, as shown in FIG. 5 using like numerals as FIG. 1 where appropriate to facilitate clarity, main electrode means 66a may extend downwardly through both layers 12 and 8 and into epitaxial layer 4, and include a p+ layer 142 forming a junction 144 with source region 44 and a junction 146 with the drift region. In another alternative, notch means such as 14 may be provided by dual notches 148 and 150, each having a gate electrode 152 and 154 corresponding respectively to gate electrodes 36 and 38, and each acting as the other's shield to afford the shielding function above described.

It is recognized that various modifications are possible within the scope of the appended claims.

I claim:

1. A bidirectional FET, comprising:
    a first source region of one conductivity type semiconductor material;
    a first channel region of opposite conductivity type semiconductor material forming a junction with said first source region;
    a single drift region of said one conductivity type semiconductor material forming another junction with said first channel region;
    a second channel region of said opposite conductivity type semiconductor material forming a junction with said drift region;
    a second source region of said one conductivity type semiconductor material forming a junction with said second channel region;
    notch means extending between and separating said first and second source regions and said first and second channel regions, and extending into said drift region;
    insulated gate means in said notch means proximate said first and second channel regions and adapted for application of an electrical potential for producing electric fields of sufficient intensity to invert the conductivity type in said first and second channel regions;
    whereby upon application of voltage of either polarity to said first and second source regions, electric current can flow in a respective corresponding direction between them under control of said electrical potential of said gate means, the conductive current path through said drift region traversing along one side of said notch means then around the end thereof then along the other side of said notch means, said FET having an OFF state in the absence of said electric gate potential, said single drift region around said notch means supporting OFF state blocking voltage in both directions;
    a field shaping region of said opposite conductivity type semiconductor material forming a junction with said drift region and extending symmetrically thereacross opposite both said channel region junctions with said drift region; and
    steering means for referencing said field shaping region to substantially the same potential as one of said source regions for one polarity voltage applied to said first and second source regions, and to substantially the same potential as the other of said source regions for the other polarity voltage applied to said first and second source regions,
    such that in one polarity of said OFF state, depletion from said first channel region junction and from said field shaping region junction extend towards each other through said drift region to straighten field lines in the latter and prevent curvature crowding of field lines at the edges of said notch means,
    and such that in the other polarity of said OFF state, depletion from said second channel region junction and from said field shaping region junction extend towards each other through said drift region to straighten field lines in the latter and prevent curvature crowding of field lines at the edges of said notch means.

2. The invention according to claim 1 wherein said channel regions are laterally spaced by said notch, means and said notch means extends downwardly from a top major surface of said FET, said drift region being below said channel regions and around the bottom of said notch means, said field shaping region being below said drift region.

3. The invention according to claim 2 wherein said source regions are laterally spaced along said top major surface by said notch means therebetween, said source regions being above respective said channel regions, said channel regions extending generally vertically along respective sides of said notch means.

4. The invention according to claim 3 comprising a pair of main electrodes each connected to a respective said source region and channel region, and wherein said insulated gate means comprises insulation layer means extending along the inner surface of said notch means, and gate electrode means disposed in said notch means along said insulation layer means such that said gate electrode means extends in close proximity along and insulated from said first vertical channel regions, wherein said notch means extends downwardly into said drift region a substantial distance below said gate electrode means to substantially diminish attraction of carriers by said gate electrode means from said drift region toward the edges of said notch means, to prevent unwanted inducement of conduction channels in said OFF state and afford higher OFF state voltage blocking capability.

5. The invention according to claim 4 wherein said gate electrode means comprises split gates comprising a first gate electrode in said notch means proximate said first channel region and a second gate electrode in said notch means proximate said second channel region, wherein the portion of said notch means below said gate electrode means comprises anodized single crystalline porous silicon oxidized to a substantially insulative condition.

6. A bidirectional FET, comprising:
   a first source region of one conductivity type semiconductor material;
   a first channel region of opposite conductivity type semiconductor material forming a junction with said first source region;
   a single drift region of said one conductivity type semiconductor material forming another junction with said first channel region;
   a second channel region of said opposite conductivity type semiconductor material forming a junction with said drift region;
   a second source region of said one conductivity type semiconductor material forming a junction with said second channel region;
   notch means extending between and separating said first and second source regions and said first and second channel regions, and extending into said drift region;
   insulated gate means in said notch means proximate said first and second channel regions and adapted for application of an electrical potential for producing electric fields of sufficient intensity to invert the conductivity type in said first and second channel regions;
   whereby upon application of voltage of either polarity to said first and second source regions, electric current can flow in a respective corresponding direction between them under control of said electrical potential of said gate means, the conductive current path through said drift region traversing along one side of said notch means then around the end thereof then along the other side of said notch means, said FET having an OFF state in the absence of said electric gate potential, said single drift region around said notch means supporting OFF state blocking voltage in both directions; and
   a field shaping region of said opposite conductivity type semiconductor material forming a junction with said drift region and extending symmetrically thereacross opposite both said channel region junctions with said drift region, such that in said OFF state depletion from said first channel region junction and from said field shaping region junction extend towards each other through said drift region to straighten field lines in latter and prevent curvature crowding of field lines at the edges of said notch means, and such that in said OFF state depletion from said second channel region junction and from said field shaping region junction extend towards each other through said drift region to straighten field lines in the latter and prevent curvature crowding of field lines at the edges of said notch means;
   a pair of main electrodes each connected to a respective said source region, wherein during said OFF state of said FET, said junction between said first channel region and said drift region blocks current flow toward one of said main electrodes, and the junction between said drift region and said second channel region blocks current flow toward the other of said main electrodes; and
   means for referencing said field shaping region to substantially the same potential as said main electrodes.

7. The invention according to claim 6 where said means for referencing said field shaping region comprises first steering diode means connected between one main electrode and said field shaping region, and second steering diode means connected between said other main electrode and said field shaping region, said diode means being connected between said main electrodes in series opposition, with said field shaping region in series therebetween.

8. The invention according to claim 7 wherein:
   said main electrodes are connected to an AC load line;
   said gate means in connected to gate potential source means;
   such that said gate means is positive with respect to one of said main electrodes during the first half cycle of said AC line, and is positive with respect to the other of said main electrodes during the second half cycle of said AC line;
   such that during the first half of said AC line, current flows from said other main electrode through said second source region, through said second channel region, through said drift region around the bottom of said notch means, through said first channel region, through said first source region to said one main electrode; and
   such that during the second half cycle of said AC line, current flows from said one main electrode through said first source region, through said first channel region, through said drift region around the bottom of said notch means, through said second channel region, through said second source region to said other main electrode.

9. The invention according to claim 8 wherein:
   during said first half cycle of said AC line, current flows from said other main electrode momentarily across a forward biased junction therebelow between said second channel region and said drift region, and then flows through said first channel region to said first source region and said one main electrode, the falling potential in said drift region across said forward biased junction relative to said gate means causing said gate means to attract given polarity carriers to said second channel region to invert the latter to said one conductivity type, such that the main current path during said first half cycle is from said other main electrode through said second source region, through second channel region, through said drift region around the bottom of said notch means, through said first channel region, through said first source region to said one main electrode; and
   such that during the second half cycle of said AC line, current flows from said one main electrode momentarily across a forward biased junction therebelow between said first channel region and said drift region and then flows through said second channel region to said second source and said other main electrode, the falling potential in said drift region across said last mentioned forward biased junction relative to said gate means causing said gate means to attract given polarity carriers to said first channel region to invert the latter to said one conductivity type, such that the main current path during said second half cycle is from said one main electrode through said first source region, through said first channel region, through said drift region around the bottom of said notch means, through said second channel region, through said second source region to said other main electrode.

10. The invention according to claim 9 wherein said gate means comprises split gate electrode means comprising a first gate electrode in said notch means proximate said first channel region and a second gate electrode in said notch means proximate said second channel region, said first and second gate electrodes being connected to said gate potential source means such that said first gate electrode is positive with respect to the first said one main electrode during the first half cycle of said AC line, and said second gate electrode is positive with respect to the second said other main electrode during the second half cycle of said AC line.

11. The invention according to claim 10 wherein said first gate electrode is referenced in said OFF state to said first main electrode, and said second gate electrode is referenced to said OFF state to said second main electrode.

12. The invention according to claim 11 comprising shielding means in said notch means insulated between said first and second gate electrodes to shield the portion of said drift region along the edge of said notch means from electric field gradients from the gate electrode along the opposite edge of said notch means, and prevent unwanted inducement of conduction channels in said drift region during said OFF state.

13. The invention according to claim 12 wherein said shielding means is referenced to each of said main electrodes such that during said first half cycle in said OFF state, said junction between said second channel region and said drift region is forward biased such that the potential in said drift region is substantially the same as the potential on said second main electrode, said first gate electrode being at the potential of said first main electrode, said shielding means being at the potential of said second main electrode, said shielding means being between said first gate electrode and the portion of said drift region along the edge of said notch means below said second channel region whereby to shield said last mentioned drift region portion from the electric field gradient from said first gate electrode otherwise causing attraction of given polarity carriers in said last mentioned drift region portion to said edge of said notch means below said second channel region causing unwanted inducement of conduction channels; and such that during said second half cycle in said OFF state, said junction between said first channel region and said drift region is forward biased such that the potential in said drift region is substantially the same as the potential on said first main electrode, said second gate electrode being at the potential of said second main electrode, said shielding being at the potential of said first main electrode, said shielding means being between said second gate electrode and the portion of said drift region along the edge of said notch means below said first channel region whereby to shield said last mentioned drift region portion from the electric field gradient from said second gate electrode otherwise causing attraction of given polarity carriers in said last mentioned drift region portion to said edge of said notch means below said first channel region causing unwanted inducement of conduction channels.

14. The invention according to claim 11 wherein said notch means comprises first and second spaced notches extending between said first and second source regions and said first and second channel regions, said first gate means being in said first notch and including a portion proximate said first channel region, said second gate means being in said second notch and including a portion proximate said second channel region.

15. The invention according to claim 14 wherein said first gate electrode is referenced to a common potential level with the first one said main electrode in said OFF state of said FET, and said second gate electrode is referenced to a common potential level with the second said other main electrode in said OFF state of said FET, whereby to afford nonfloating gates each of which shields the drift region portion along its respective notch edge from the other gate electrode.

16. A bidirectional lateral power FET, comprising:
an epitaxial layer of semiconductor material of one conductivity type having a top major surface;
a pair of channel regions of the other conductivity type laterally spaced in said epitaxial layer;
a pair of source regions of said one conductivity type laterally spaced along said top major surface and each forming a junction with respective one of said channel regions;
notch means extending downwardly from said top major surface between said source regions and said channel regions into a single drift region in said epitaxial layer, such that the conductive current path is directed from one source region through one said channel region, downwardly into said drift region along one side of said notch means, then around the bottom of said notch means, then upwardly along the other side of said notch means in said drift region, through the other said channel region to the other said source region, with the same path conducting current in the reverse direction from said other source region to said one source region;
a pair of main electrodes connected respectively to said source regions;
insulated gate electrode means in said notch means including portions proximate said channel regions for attracting given polarity carriers to invert said channel regions to said one conductivity type in response to given gate potential, such that current may flow in either direction between said main electrodes;
said FET having an OFF state in the absence of said given gate potential, with the junction between said drift region and said one channel region blocking current flow toward one said main electrode, and with the junction between said drift region and said other channel region blocking current flow toward the other said main electrode, said single drift region around said notch means supporting OFF state blocking voltage in both directions;

a field shaping region of said opposite conductivity type semiconductor material forming a junction with said drift region opposite said channel region junctions with said drift region; and steering means for referencing said field shaping region to substantially the same potential as one of said main electrodes for one polarity of voltage applied to said main electrodes, and to substantially the same potential as the other of said main electrodes for the other polarity voltage applied to said main electrodes, such that in one polarity of said OFF state, depletion from said first channel region junction and from said field shaping region junction spread towards each other through said drift region to straighten field lines in the latter and prevent curvature crowding of field lines at edges of said notch means, and such that in the other polarity of said OFF state, depletion from said second channel region junction and from said field shaping region junction spread towards each other through said drift region to straighten out field lines in the latter and prevent curvature crowding of field lines at edges of said notch means.

17. A bidirectional lateral power FET, comprising:

an epitaxial layer of semiconductor material of one conductivity type having a top major surface;

a pair of channel regions of the other conductivity type laterally spaced in said epitaxial layer;

a pair of source regions of said one conductivity type laterally spaced along said top major surface and each forming a junction with respective one of said channel regions;

notch means extending downwardly from said top major surface between said source regions and said channel regions into a single drift region in said epitaxial layer, such that the conductive current path is directed from one source region through one said channel region, downwardly into said drift region along one side of said notch means, then around the bottom of said notch means, then upwardly along the other side of said notch means in said drift region, through the other said channel region to the other said source region, with the same path conducting current in the reverse direction from said other source region to said one source region;

a pair of main electrodes connected respectively to said source regions;

insulated gate electrode means in said notch means including portions proximate said channel regions for attracting given polarity carriers to invert said channel regions to said one conductivity type in response to given gate potential, such that current may flow in either direction between said main electrodes;

said FET having an OFF state in the absence of said given gate potential, with the junction between said drift region and said one channel region blocking current flow toward one said main electrode, and with the junction between said drift region and said other channel region blocking current flow toward the other of said main electrode, said single drift region around said notch means supporting OFF state blocking voltage in both directions; and a field shaping region of said opposite conductivity type semiconductor material forming a junction with said drift region opposite said channel region junctions with said drift region, such that in said OFF state depletion from said first channel region junction and from said field shaping region junction spread towards each other through said drift region to straighten field lines in the latter and prevent curvature crowding of field lines at edges of said notch means, and such that in said OFF state depletion from said second channel region junction and from said field shaping region junction spread towards each other through said drift region to straighten out field lines in the latter and prevent curvature crowding of field lines at edges of said notch means;

wherein said field shaping region is below said drift region, and including means referencing said field shaping region to substantially the same potential as said main electrodes to provide said depletion from said junction between said field shaping region and said drift region.

18. The invention according to claim 17 wherein said means referencing said field shaping region comprises first and second steering diodes connected between said main terminals in series opposition, with said field shaping region interposed therebetween.

19. The invention according to claim 18 wherein said epitaxial layer is n type and said field shaping region is p type, said first diode having an anode in contact with said field shaping region and a cathode in contact with one said main electrode, said second diode having an anode in contact with said field shaping region and a cathode in contact with the other said main electrode.

* * * * *